(12) United States Patent
Ushirozawa

(10) Patent No.: US 6,452,953 B1
(45) Date of Patent: Sep. 17, 2002

(54) LIGHT SOURCE

(75) Inventor: Mizuyuki Ushirozawa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/363,040

(22) Filed: Jul. 29, 1999

(30) Foreign Application Priority Data

Sep. 2, 1998 (JP) .......................................... 10-247673

(51) Int. Cl.[7] ................................................ H01S 3/10
(52) U.S. Cl. ...................... 372/20; 372/29.01; 372/26; 372/29.015
(58) Field of Search .............................. 372/20, 32, 81, 372/29.01, 98.6, 26, 29.015; 332/7.51; 381/57

(56) References Cited

U.S. PATENT DOCUMENTS

| | | | |
|---|---|---|---|
| 4,789,843 A | * | 12/1988 | Hicks .......................... 332/7.51 |
| 6,104,516 A | * | 8/2000 | Majima ........................ 372/20 |
| 6,212,210 B1 | * | 4/2001 | Serizawa ..................... 372/32 |

FOREIGN PATENT DOCUMENTS

| | | | | |
|---|---|---|---|---|
| JP | 405299739 A | * | 11/1993 | |
| JP | 406085362 A | * | 3/1994 | ................... 372/81 |
| JP | 406085578 A | * | 3/1994 | ................... 381/57 |
| JP | 6-232844 | | 8/1994 | |
| JP | 9-49948 | | 2/1997 | |
| JP | 9-191293 | | 7/1997 | |
| JP | 10-229231 | | 8/1998 | |

OTHER PUBLICATIONS

Wittke et al; Stabilization of CW Injection Lasers; Technical Notes, TN No. 1005;Sheets 1–3, Apr. 9, 1975.*

* cited by examiner

*Primary Examiner*—Leon Scott, Jr.
(74) *Attorney, Agent, or Firm*—McGinn & Gibb, PLLC

(57) ABSTRACT

A light source in which a signal light having a wavelength outside a normal tolerance is not supplied to the outside of the light source. A temperature control circuit controls an optical switch so that the signal light outputted from a laser diode (LD) module is not supplied to the outside unless a temperature of the LD comes to be within the normal tolerance. An LD-driving circuit supplies a current to the LD in the LD module, and controls a light power outputted from the LD.

14 Claims, 9 Drawing Sheets

EXTINCTION CHARACTERISTIC OF LN EXTERNAL MODULATOR

EXTINCTION CHARACTERISTIC OF ELECTROABSORPTION MODULATOR

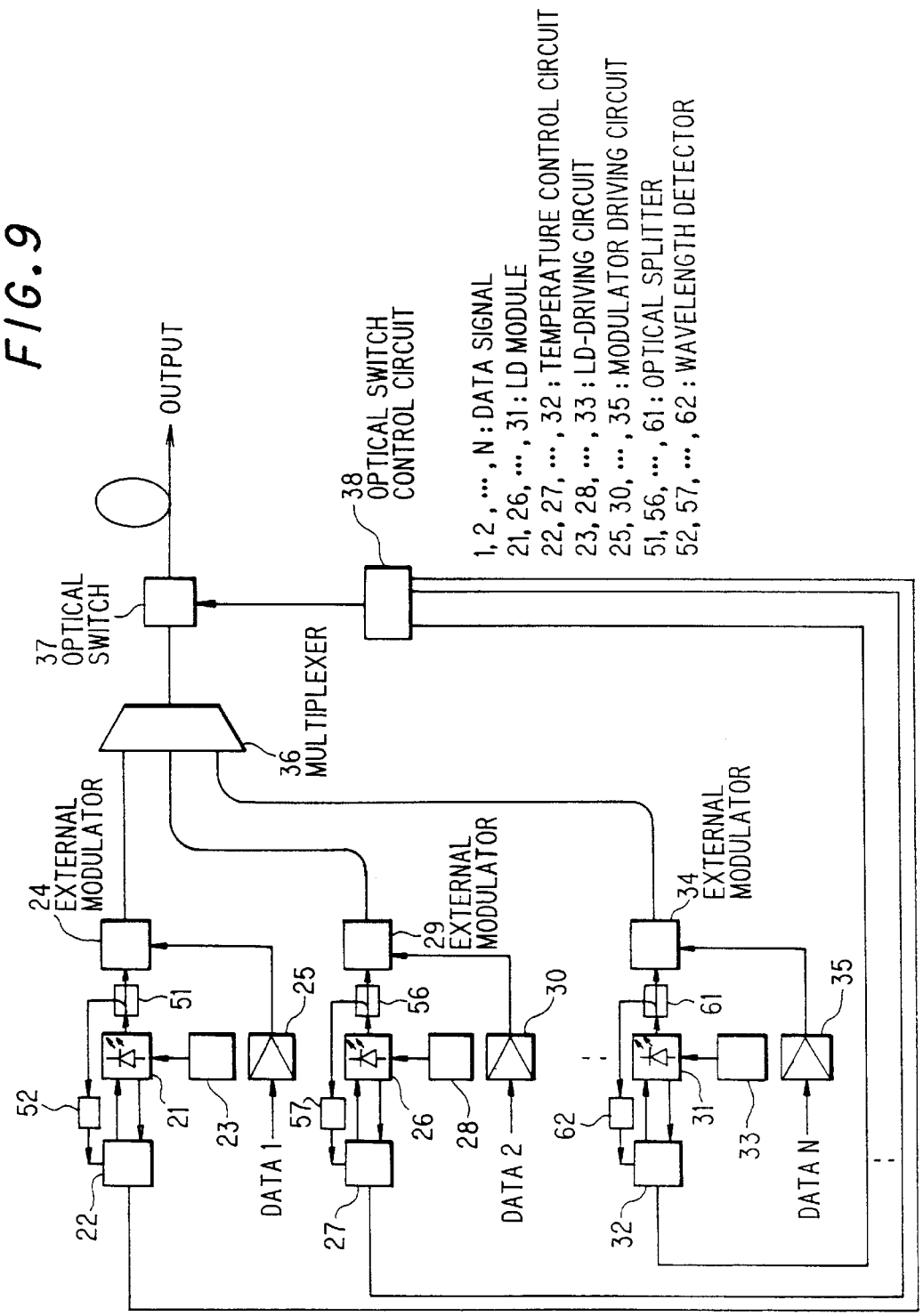

LIGHT SOURCE

FIELD OF THE INVENTION

The invention relates to the light source, and especially to the method for controlling a temperature of the light source used in the optical transmitter.

For realization of a wavelength division multiplexed (WDM, hereinafter) optical transmission system, it is very important to accurately control the wavelengths of signal lights outputted from an optical transmitter. The light source used in the WDM optical communication system comprises plural semiconductor laser diodes (LDs, hereinafter) serving as light emitting elements. Since the wavelength of a signal light emitted from the LD is closely related to a temperature of the LD, it is indispensable to precisely control the temperature of the LD in order to stabilize the wavelength of the signal light at a predetermined value. For example, the light source disclosed in Japanese Patent Kokai 9-191293, the LD is combined with a thermistor for detecting the temperature of the LD and a Peltier for cooling or heating the LD in accordance with a current supplied thereto, and supply of the driving current to the LD starts, when the temperature of the LD comes to be within the normal tolerance about the predetermined temperature. However, according to the aforementioned light source, the temperature of the LD deviates from the predetermined value to some extent because of heat generated by a driving current supplied the LD, and it is several seconds before the temperature of the LD, in other words, the wavelength of the signal light, comes to be within the normal tolerance. In order to remove the aforementioned disadvantage, it is extremely desirable to develop the light source, in which the temperature of the LD is controlled in condition that the driving current is being supplied to the LD and supply of the signal light to the outside is suppressed till the temperature of the LD comes to be within the normal tolerance.

SUMMARY OF THE INVENTION

It is an object of the invention to provide a light source, which comprises a single LD and forms a foundation of a large scale light source for a WDM optical transmission system.

It is a further object of the invention to provide a light source, which comprises a single LD, forms a foundation of a large scale light source for a WDM optical transmission system and is provided with means for improving an accuracy of control.

It is a still further object of the invention to provide a light source, which comprises plural LDs and is used for a WDM optical transmission system.

It is a yet further object of the invention to provide a light source, which comprises plural LDs, is used for a WDM optical transmission system and provided with means for improving an accuracy of control.

According to the first feature of the invention, a light source comprises:

a semiconductor laser diode (LD, hereinafter) module, which comprises a LD serving as a light-emitting element and means for detecting a temperature of the LD; and means for suppressing supply of a light outputted from sad LD module to an outside till the temperature of the LD comes to be within a predetermined normal tolerance.

According to the second feature of the invention, a light source comprises:

a LD module, which comprises a LD serving as a light-emitting element and means for detecting a temperature of the LD, means for detecting a wavelength of a light outputted from the LD module, and means for suppressing supply of the light to an outside till the wavelength of the light comes to be within a predetermined normal tolerance.

According to the third feature of the invention, a light source comprises:

plural LD modules, each of which comprises a LD serving as a light-emitting element and means for detecting a temperature of the LD, a multiplexer for multiplexing plural lights respectively outputted from the plural LD modules, and means for suppressing supply of the multiplexed plural lights to an outside till temperatures of all the LDs come to be within predetermined normal tolerances.

According to the fourth feature of the invention, a light source comprises:

plural LD modules, each of which comprises a LD serving as a light-emitting element and means for detecting a temperature of the LD, a multiplexer for multiplexing plural lights respectively outputted from the plural LD modules, plural means for respectively detecting wavelengths of the plural lights, and means for suppressing supply of the multiplexed plural lights to an outside till the wavelengths of all the plural lights come to be within predetermined normal tolerances.

BRIEF DESCRIPTION OF THE DRAWINGS

The invention will be explained in more detail in conjunction with appended drawings, wherein:

FIG. 9 shows a structure of a light source according to the sixth preferred embodiment of the invention.

DESCRIPTION OF THE PREFERRED EMBODIMENTS

Before explaining a light source in the preferred embodiments according to the invention, the aforementioned conventional light source will be explained.

In general, since the wavelength of the signal light outputted from the optical transmitter is not stabilized after a power supply of the optical transmitter is turned on, an apparatus receiving the signal light outputted from the optical transmitter sometimes operates in error, while the wavelength of the signal light is not stabilized. In order to solve this problem, a light source of the optical transmitter which outputs the signal light to the outside only in case that a temperature of a light emitting element in the light source is within a normal tolerance is proposed.

Figure 1:
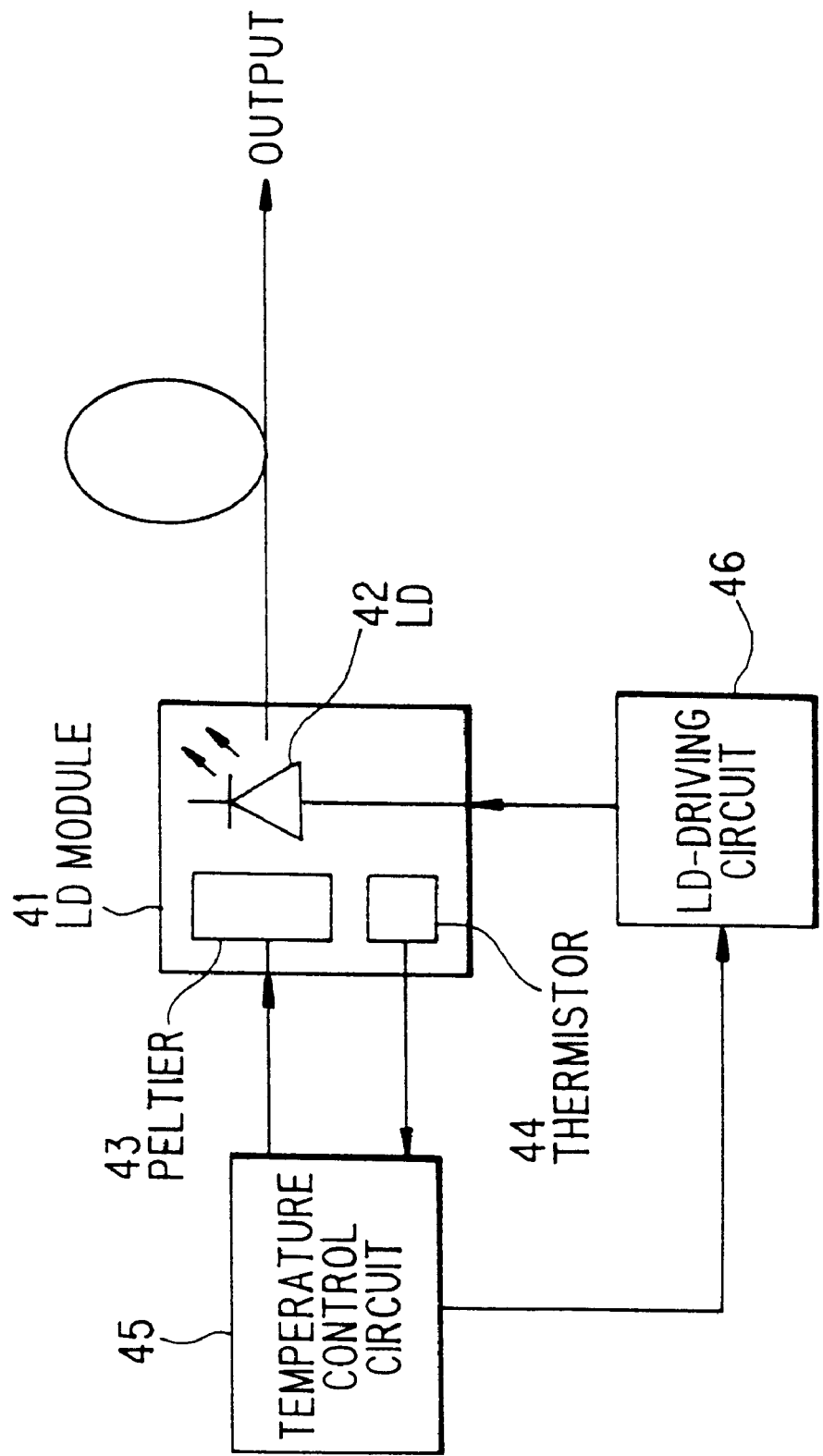
FIG. 1 shows a structure of a conventional light source.

For example, as shown in FIG. 1, in the light source mentioned in the above, the temperature control circuit 45 controls the LD driving circuit 46 so that the temperature of a semiconductor laser diode (LD, hereinafter) 42 serving as a light-emitting element in a LD module 41 maintains a predetermined value on the basis of a resistance of a thermistor 44, a resistance of which changes in accordance with the temperature of the LD 42.

As shown in FIG. 1, the LD module 41 is provided with the LD 42 serving as the light emitting element, the thermistor 44, the resistance of which changes in accordance with the temperature of the LD 42, and a Peltier 43, which cools or heats the LD 42 in accordance with a direction of a current supplied thereto.

The temperature control circuit 45 controls the current supplied to the Peltier 43 so that the resistance of the thermistor 44, in other words, the temperature of the LD 42, maintains a predetermined value. The LD driving circuit 46 supplies a current to the LD 42 in the LD module 41, and controls an output light power from the LD 42. Moreover, the LD-driving circuit 46 has the function of turning the current supplied to the LD 42 on or off in accordance with a signal outputted from the temperature control circuit 45.

In general, it is possible to keep the wavelength of the light emitted from the LD 42 nearly constant by stabilizing the temperature of the LD 42. The temperature control circuit 45 controls the current supplied to the Peltier 43 so that the resistance of the thermistor 44, in other words the temperature of the LD 42, maintains a predetermined value.

Figure 2:
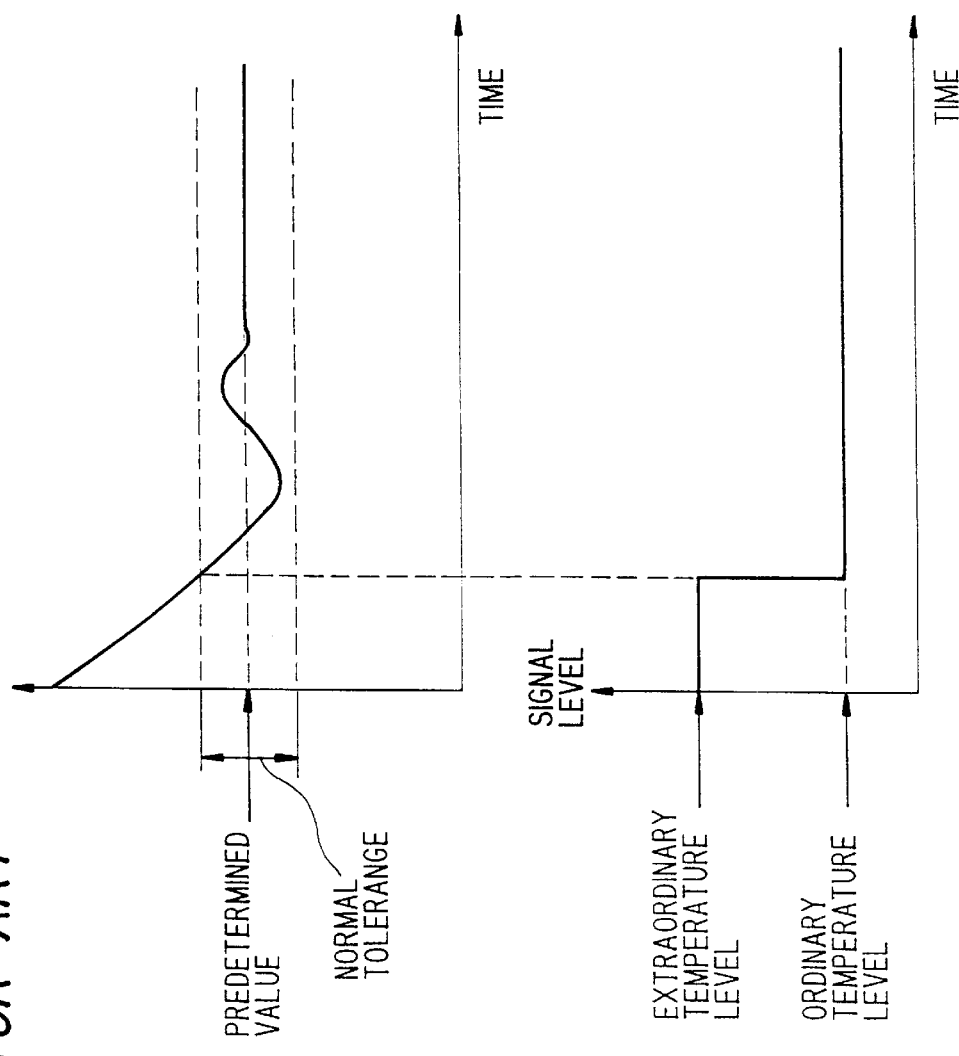
FIG. 2 explains an operation of a conventional light source shown in FIG. 1.

However, as shown in an upper part of FIG. 2, in case that a power supply of the light source is turned on and the temperature of the LD 42 deviates from the predetermined value, it takes several seconds to stabilize the temperature thereof within a normal tolerance. In the aforementioned period, the temperature control circuit 45 outputs an extraordinary temperature signal for notifying that the temperature of the LD 42 is extraordinary to the LD driving circuit 46 as shown in a lower part of FIG. 2.

While the extraordinary temperature signal is outputted from the temperature control circuit 45, the LD driving circuit 46 stops supplying the current to the LD 42, and the output of the LD 42 ceases. When the extraordinary temperature signal is stopped, the LD-driving circuit 46 starts to supply the current to the LD 42 so that the LD 42 outputs the signal light. The aforementioned method for controlling the temperature of the light source is disclosed in Japanese Patent Kokai No. 9-191293.

In the aforementioned conventional method for controlling the temperature of the light source, the supply of the driving current to the LD starts, when the temperature of the LD comes to be within the normal tolerance. However, according to the aforementioned method, when the supply of the driving current to the LD starts, the temperature of the LD becomes unstable to some extent due to the heat generated therein by the driving current, hence the wavelength of the output light becomes unstable to some degree.

Figure 3:
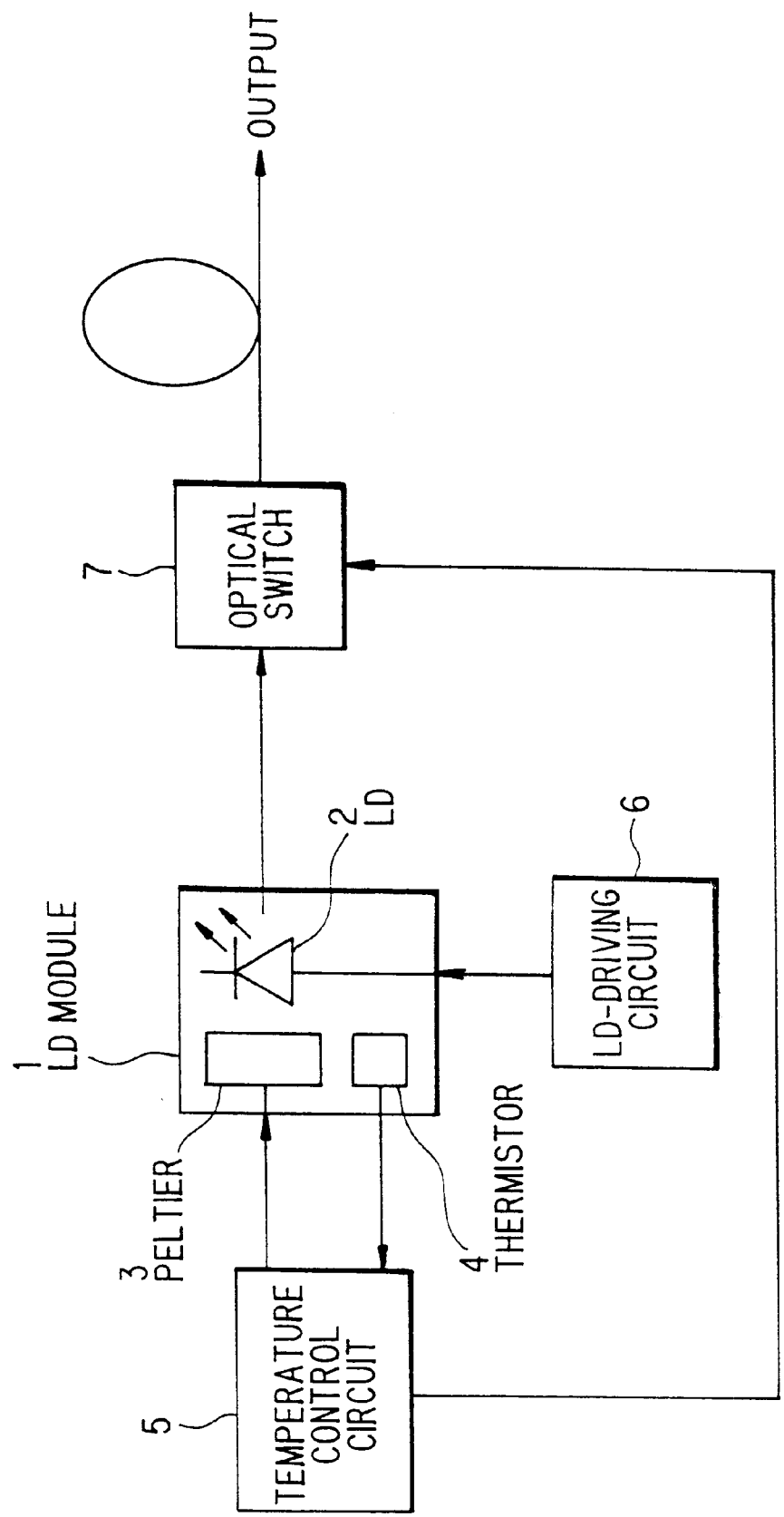
FIG. 3 shows a structure of a light source according to the first preferred embodiment of the invention.

Next, the first preferred embodiment of the invention will be explained referring to an appended drawing. FIG. 3 shows a structure of a light source according to the first preferred embodiment is composed of a semiconductor laser diode (LD, hereinafter) module 1, a temperature control circuit 5, a LD-driving circuit 6 and an optical switch 7.

The LD module 1 is provided with the LD 2 as a light-emitting element, a thermistor 4, a resistance of which changes in accordance with a temperature of the LD 2, and a Peltier 3, which cools or heats the LD 2 in accordance with a direction of current flowing therethrough.

The temperature control circuit 5 controls the optical switch 7 so that a light generated by the LD module 1 is not supplied to the outside till the resistance of the thermistor 4, that is to say, the temperature of the LD 2, becomes a predetermined value. The LD-driving circuit 6 supplies the current to the LD 2 in the LD module 1, and controls the output light power of the LD 2.

In general, the wavelength of the light emitted from the LD 2 can be kept to be nearly constant by stabilizing the temperature of the LD 2. The temperature control circuit 5 controls the current supplied to the Peltier 3 so that the temperature of the LD 2 maintains a predetermined value.

In the conventional light source, when the temperature of the LD comes to be within a normal tolerance, supply of a driving current of the LD starts, hence the temperature of the LD, in other words the wavelength of the light, becomes unstable to some extent directly after supply of the driving current because of heat generated inn the LD by the driving current.

In the first preferred embodiment of the invention, since the temperature of the LD 2 is stabilized in condition that the driving current is being supplied to the LD 2 and the optical switch 7 is turned on after the temperature of the LD 2 comes to be within the normal tolerance, the light is not supplied to the outside before the wavelength is stabilized and the aforementioned problem can be solved.

Figure 4:
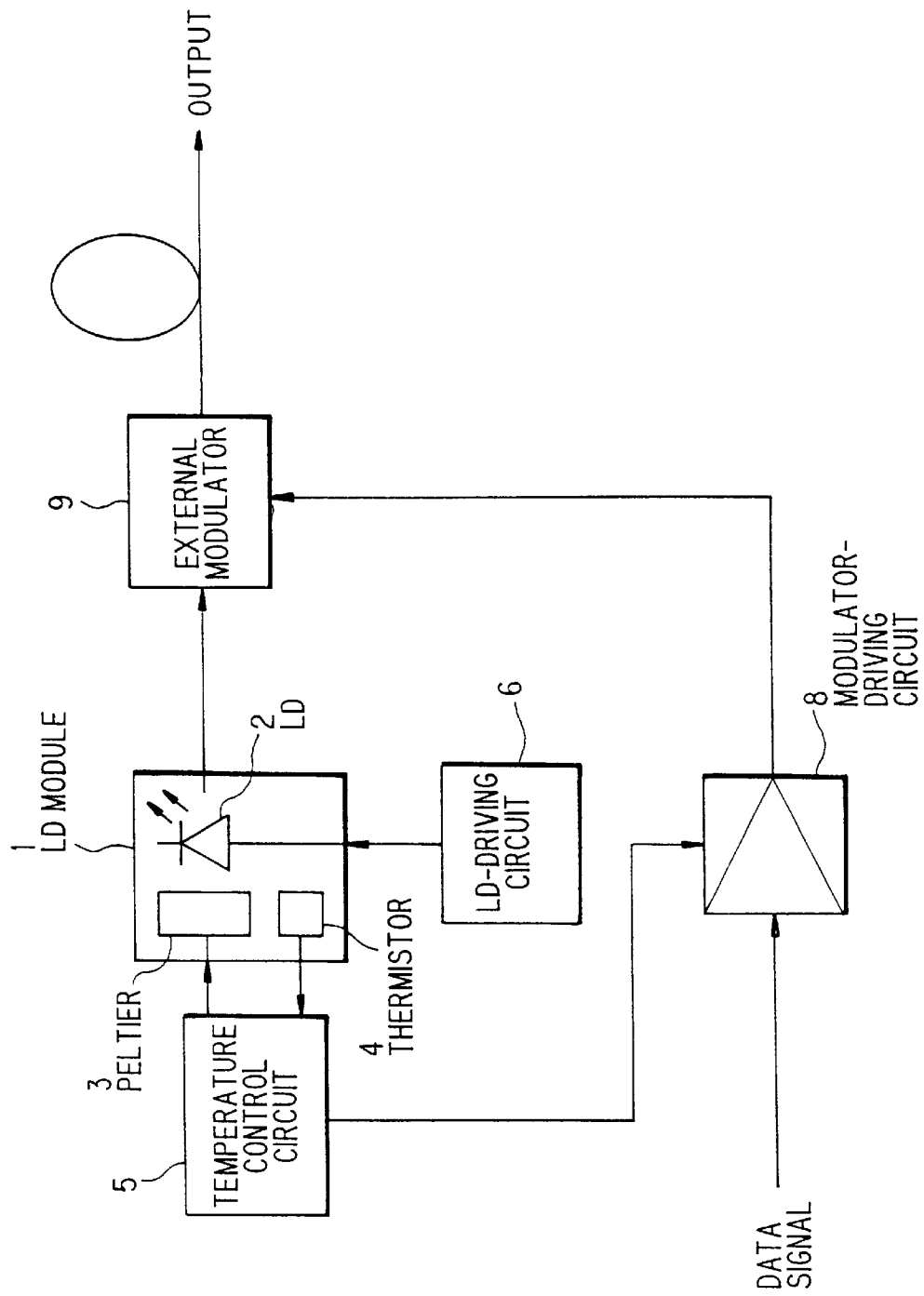
FIG. 4 shows a structure of a light source according to the second preferred embodiment of the invention.

FIG. 4 is a block diagram for showing a light source according to the second preferred embodiment of the invention. As shown in FIG. 4, the light source according to the second preferred embodiment is composed of a LD module 1, a temperature control circuit 5, a LD-driving circuit 6, a modulator-driving circuit 8 and an external modulator 9.

The LD module 1 is provided with a LD 2 serving as a light-emitting element, a thermistor 4, a resistance of which changes in accordance with the temperature of the LD 2, a Peltier 3, which cools or heats the LD 2 in accordance with a direction of a current flowing therethrough.

The temperature control circuit 5 controls the modulator-driving circuit 8 so that an output light power is not supplied to the outside till the resistance of the thermistor 4, in other words, the temperature of the LD 2, becomes a predetermined value. The LD-driving circuit 6 supplies the current to the LD 2, and controls the output light power of the LD 2.

The modulator-driving circuit 8 amplifies an inputted data signal to a sufficient level for driving the external modulator 9, which converts an electrical signal into an optical signal. Moreover, the modulator-driving circuit 8 supplies a voltage for sufficiently extinguishing the output light of the external modulator 9 to the same, while the temperature control circuit 5 outputs an extraordinary temperature signal.

Figure 5A:
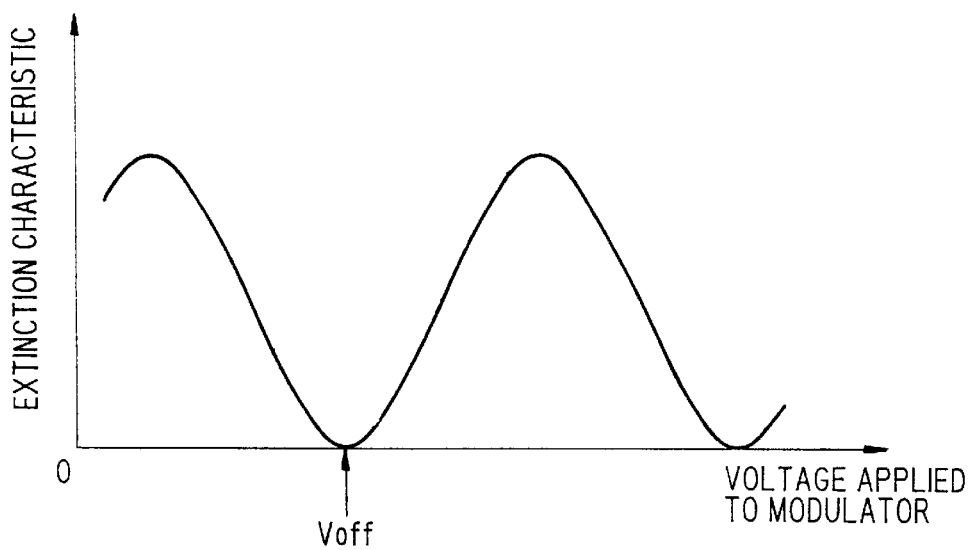
FIG. 5A shows an extinction characteristic of a LN external modulator.
Figure 5B:
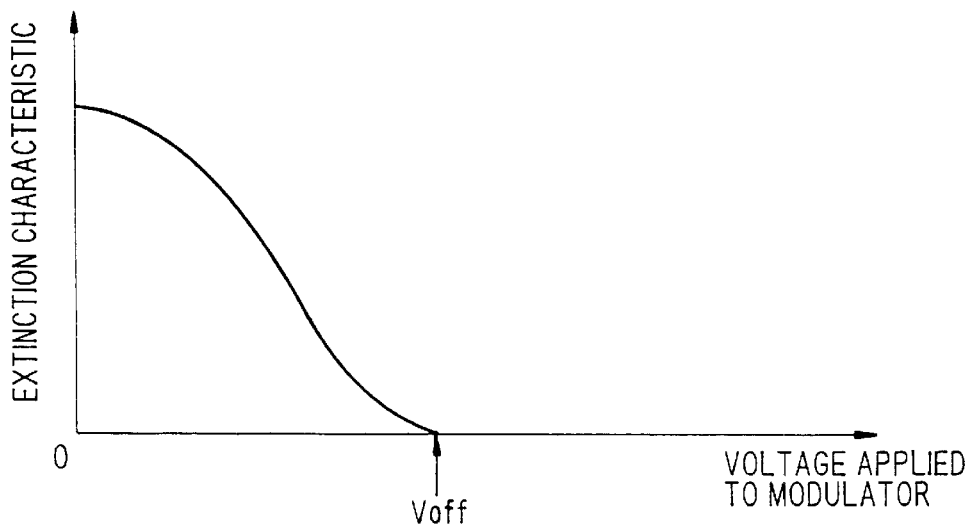
FIG. 5B shows an extinction characteristic of an electro-absorption modulator.

FIG. 5A shows the extinction characteristic of a LN ($LiNbO_3$) external modulator, and FIG. 5B shows the same of an electroabsorption modulator. The second preferred embodiment will be explained referring to FIG. 4 and FIGS. 5A and 5B.

In the light source according to the second preferred embodiment of the invention, the light emitted from the light module 1 is supplied to the outside via the external modulator 9. The LN external modulator or the electroabsorption modulator is often used as the external modulator 9.

The modulator-driving circuit 8 amplifies an inputted data signal to a sufficient amplitude for driving the external modulator 9, which converts an electrical signal into an optical signal. Moreover, as shown in FIGS. 5A and 5B, the modulator-driving circuit 8 outputs a voltage $V_{off}$ which sufficiently extinguishes the light outputted from the external modulator 9, while the temperature control circuit 5 supplies an extraordinary temperature signal to the modulator-driving circuit 8. As the result, the light source according to the second preferred embodiment can achieve the same effect as that achieved by the light source according to the first preferred embodiment.

Figure 6:
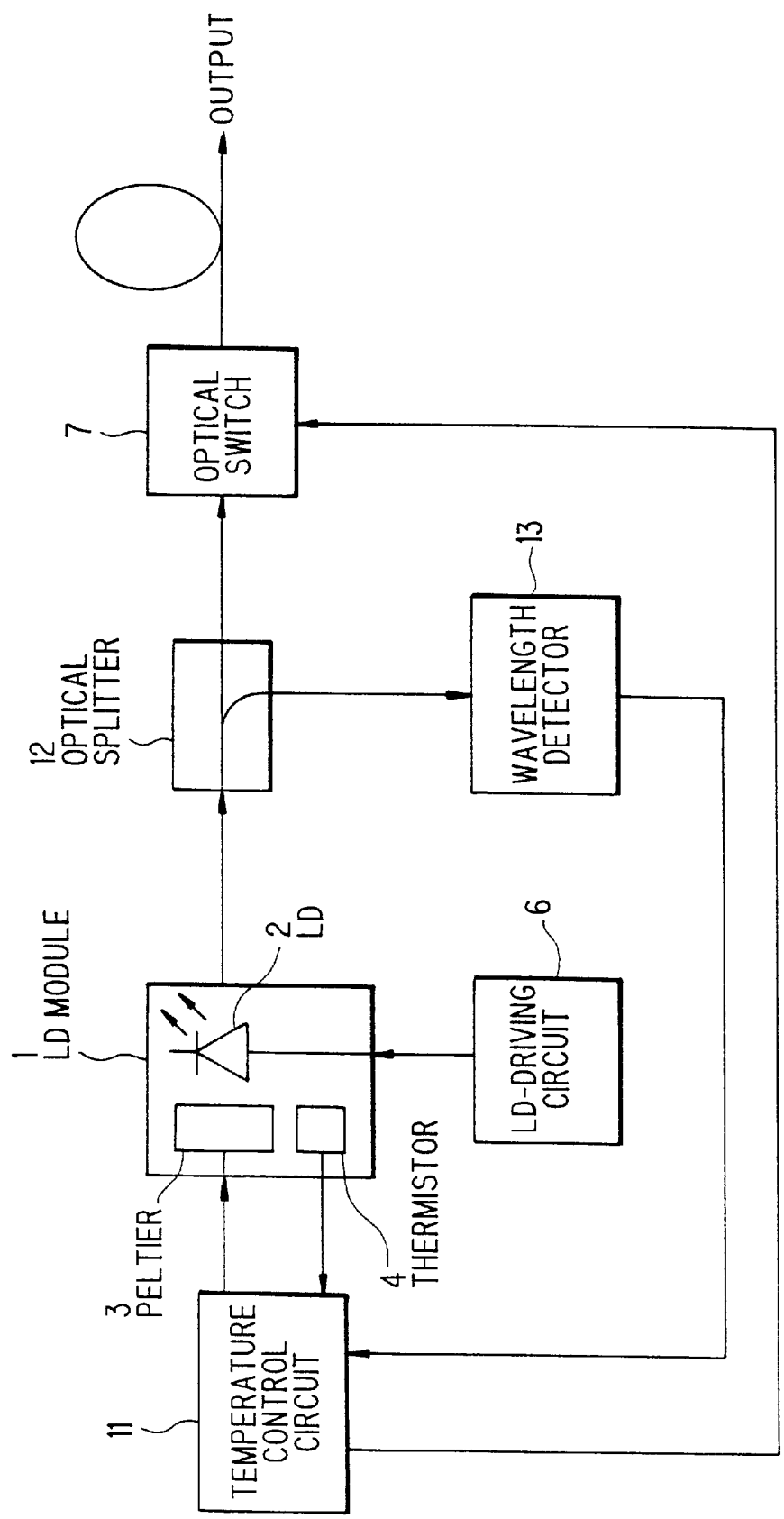
FIG. 6 shows a structure of a light source according to the third preferred embodiment of the invention.

FIG. 6 shows a structure of a light source according to the third preferred embodiment of the invention. As seen from FIGS. 3 and 6, the structure of the light source according to the third preferred embodiment is the same as that according to the first preferred embodiment except that the former is provided with a temperature control circuit 11, an optical splitter 12 and a wavelength detector 13. In FIGS. 3 and 6, the structural elements having the same functions are expressed by the same notations.

Even in case that the temperature of the LD 2 is kept to be constant, the wavelength of the signal light emitted from the LD 2 fluctuates to some extent on account of the fluctuation of the driving current supplied to the LD 2, and the amount of the fluctuation is about several hundred MHz/mA. In the third preferred embodiment, the wavelength detector 13 is used in order to remove the dependency of the wavelength on the driving current.

The signal light emitted from the LD module 1 is splitted into two parts by the optical splitter 12. The greater part of the light is supplied to the optical switch 7, and the remaining part of the same is supplied to the wavelength detector 13, in which the wavelength of the light is detected. An output signal of the wavelength detector 13 is supplied to the temperature control circuit 11.

The temperature control circuit 11 controls the current supplied to the Peltier on the basis of the output signal of the wavelength detector 13 so that the wavelength of the signal light outputted from the LD module 1 maintains a predetermined value. Moreover, the temperature control circuit 11 outputs a signal for notifying whether the wavelength is ordinary or not to the optical switch 7 on the basis of the output signal of the wavelength detector 13.

In case that the wavelength of the signal light outputted from the LD module 1 is ordinary, the switch 7 supplies the signal light outputted from the light module 1 to the outside. As the result, according to the third preferred embodiment of the invention, the signal light can be supplied to the outside through a monitoring circuit having a higher accuracy than those used in the first and second preferred embodiments of the invention.

Figure 7:
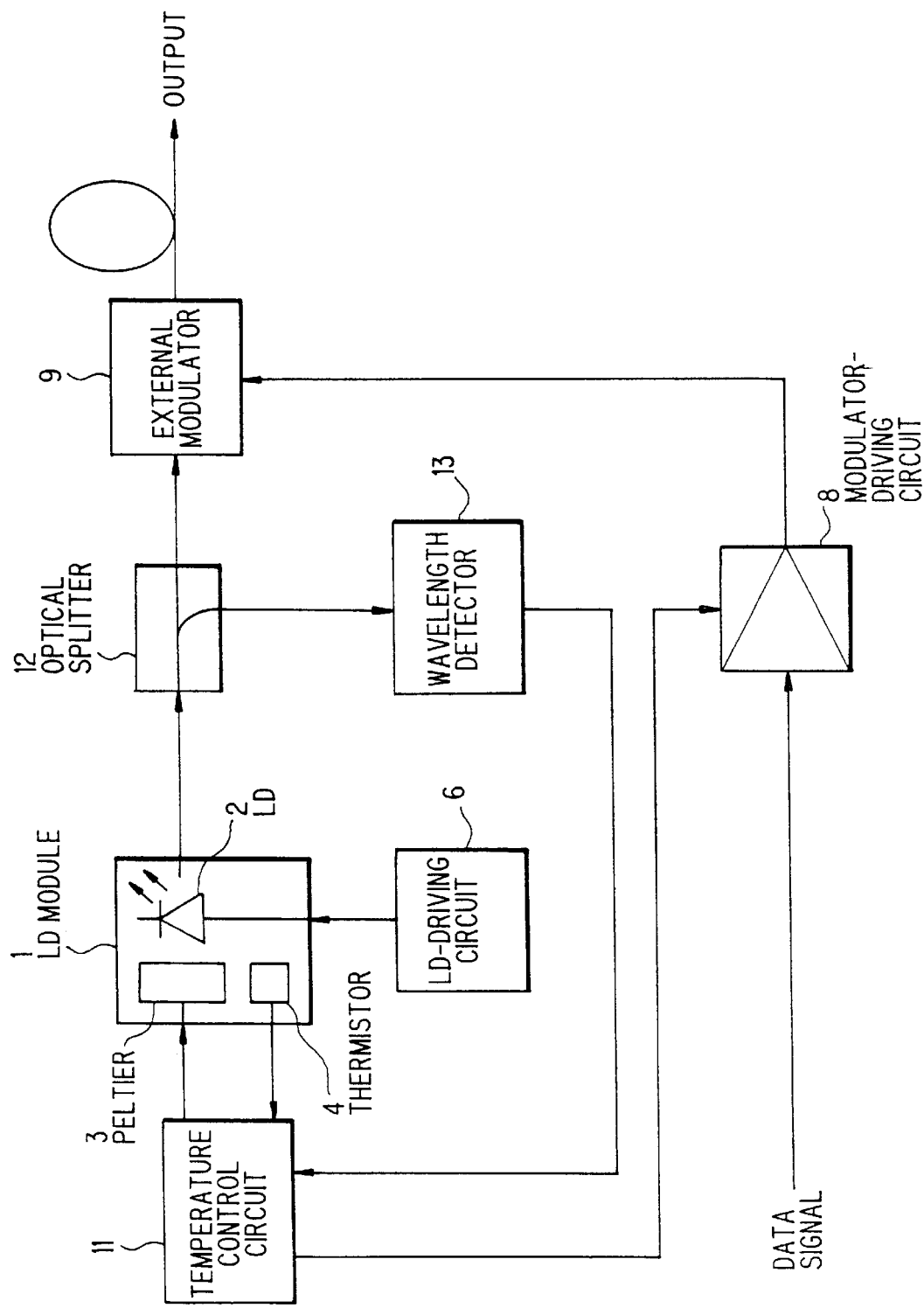
FIG. 7 shows a structure of a light source according to the fourth preferred embodiment of the invention.

FIG. 7 shows a structure of a light source according to the fourth preferred embodiment of the invention. The structure of the fourth preferred embodiment is the same as that of the second preferred embodiment shown in FIG. 4 except that the former is provided with the temperature control circuit 11, an optical splitter 12 and a wavelength detector 13. In FIGS. 4 and 7, the structural elements having the same functions are expressed by the same notations.

The signal light emitted from the LD module 1 is splitted by the optical splitter 12 into two parts. The greater part of the signal light is supplied to the external modulator 9, and the remaining part of the same is supplied to the wavelength detector 13, which detects the wavelength of the signal light supplied thereto. The output signal of the wavelength detector 13 is supplied to the temperature control circuit 11.

The temperature control circuit 11 controls the current supplied to the Peltier 3 on the basis of the output signal of the wavelength detector 13 so that the wavelength of the signal light maintains a predetermined value. Moreover, the temperature control circuit 11 supplies an output signal for notifying whether the wavelength is normal or not to the modulator-driving circuit 8.

In case that the wavelength of the signal light emitted from the LD module 1 is normal, the modulator driving circuit 8 outputs the light emitted from the LD module 1 to the outside by driving an external modulator 9. Moreover, in case that the wavelength of the signal light emitted from the LD module 1 is abnormal, the modulator driving circuit 8 outputs a sufficient voltage for extinguishing the output light of the external demodulator 9. As the result, according to the fourth preferred embodiment, the output light of the LD module 1 can be supplied to the outside through the monitoring circuit having a higher accuracy than that used in the second preferred embodiment.

Figure 8:
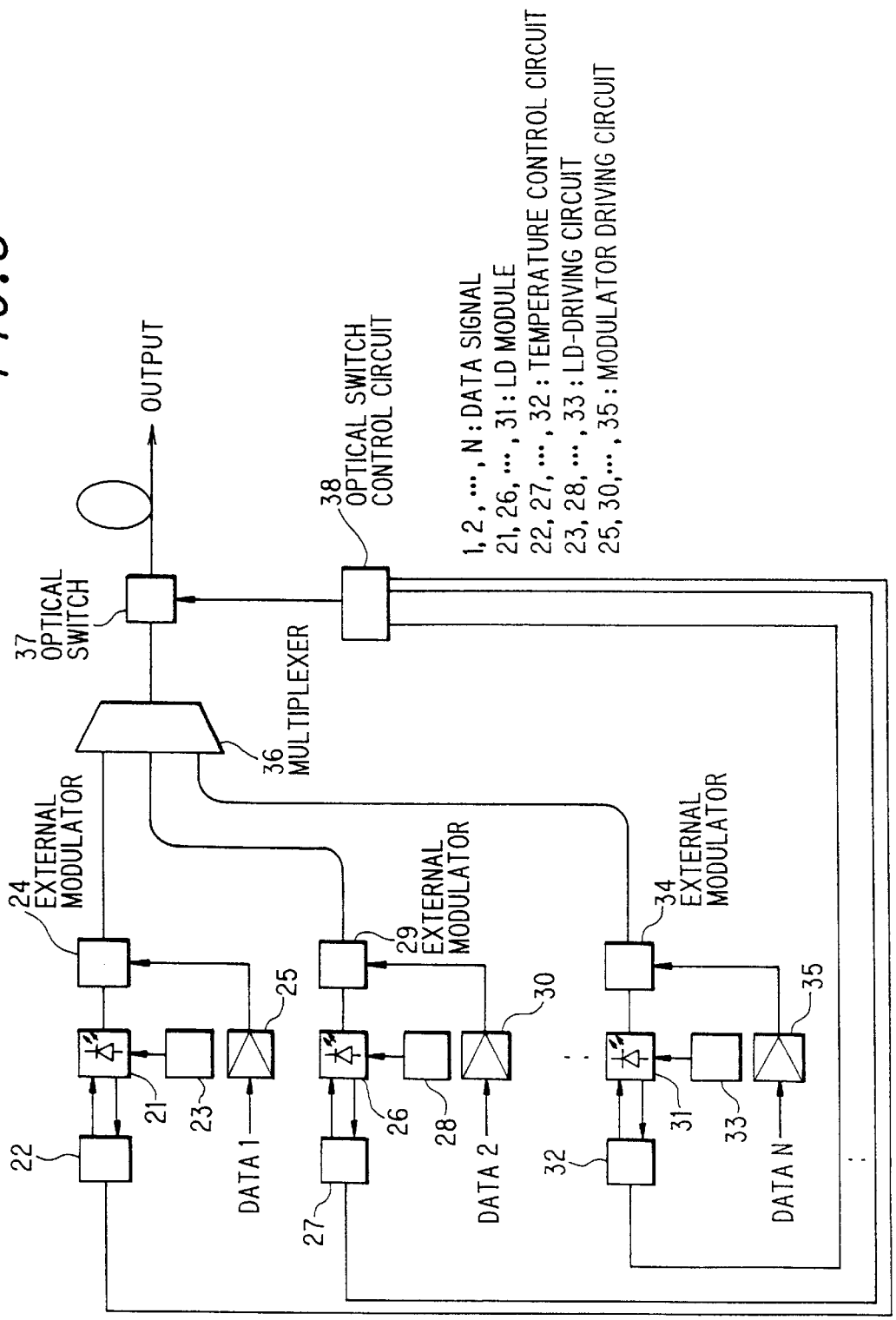
FIG. 8 shows a structure of a light source according to the fifth preferred embodiment of the invention.

FIG. 8 shows a structure of a light source according to the fifth preferred embodiment of the invention. According to the fifth preferred embodiment of the invention, a WDM optical transmitting system can be simplified as compared with that obtained by combining the plural light sources according to the first, the second third or the fourth preferred embodiment.

That is to say, in the fifth preferred embodiment, after the lights emitted from the first to the Nth light modules 21 and 31 are respectively modulated by the first to Nth external modulators 24 to 34 and multiplexed by a multiplexer 36, the multiplexed signal lights are turned on or off by a single optical switch 37.

The light source according to the fifth preferred embodiment of the invention is composed of the LD modules 21, 26, - - -, 31, temperature control circuits 22, 27, - - -, 32, LD driving circuit 23, 28, - - -, 32, the external modulators 24, 29, - - -, 34, modulator-driving circuits 25, 30, - - -. 35, the multiplexer 36, the optical switch 37, and an optical switch control circuit 38.

The optical switch control circuit 38 monitors extraordinary temperature signals outputted from the first to the Nth temperature control circuits 22 to 32. When the temperatures of the first to the Nth LD modules 21 to 31 come to be within a normal tolerance, the optical switch 37 outputs the signal lights to the outside in accordance with a control signal outputted from the optical switch control circuit 38.

In the fifth preferred embodiment of the invention, although the wavelengths of the lights emitted from the LD modules 21, 26, - - - , 31 are estimated through the temperatures thereof, the wavelength detectors used in the fourth preferred embodiment can be adopted as more accurate means for detecting the wavelengths of the lights.

FIG. 9 shows a structure of a light source according to the sixth preferred embodiment of the invention. The structure of the light source shown in FIG. 9 is the same as that of the light source shown in FIG. 8 except that the former is provided with optical splitters 51, 56, - - - , 61 and wavelength detectors 52, 57, - - - , 62. The functions of these newly added structural elements are the same those shown in FIG. 7 (the fourth preferred embodiment).

The effects of the invention can be summarized as follows.

In the light source according to the invention, the light source comprises means for detecting the temperature of the LD, and the signal light is not supplied to the outside till the temperature of the LD comes to be within a predetermined normal tolerance.

Moreover, in the light source according to the other preferred embodiment of the invention, since the light source is provided with means for detecting the wavelength of the light emitted from the LD, the signal light is not supplied to the outside till the wavelength of the signal light comes to be within a predetermined normal tolerance.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set fourth.

What is claimed is:

1. A light source, comprising:
    a semiconductor laser diode (LD) module having an LD serving as a light-emitting element and a sensor for detecting a temperature of said LD; and
    a suppressor for blocking a transmission of a light output from said LD module until said temperature of said LD comes to be within a predetermined normal tolerance.

2. A light source according to claim 1, wherein said suppressor comprises an optical switch.

3. A light source according to claim 1, wherein said suppressor comprises an external modulator.

4. A light source according to claim 3, wherein said external modulator is controlled by a modulator-driving circuit, which supplies a control voltage sufficient for extinguishing said output of said external modulator.

5. A light source, comprising:
    a laser diode (LD) module having an LD serving as a light-emitting element and a sensor detecting a temperature of said LD;
    a wavelength detector detecting a wavelength of a light output from said LD module; and
    a light-blocking device to block said light output except when said wavelength is within a predetermined normal tolerance.

6. A light source according to claim 5, wherein said light-blocking device comprises an optical switch.

7. A light source according to claim 5, wherein said light-blocking device comprises an external modulator.

8. A light source according to claim 5, wherein said external modulator is controlled by a modulator-driving circuit, which supplies a control voltage sufficient for extinguishing said output of said external modulator.

9. A light source, comprising:
    plural laser diode (LD) modules, each of which comprises an LD serving as a light-emitting element and a sensor detecting a temperature of said LD;
    a multiplexer for multiplexing plural lights respectively outputted from said plural LD modules; and
    a light-blocking device blocking off said multiplexed plural lights unless temperatures of all said LDs are within predetermined normal tolerances.

10. A light source according to claim 9, wherein said light-blocking device comprises an optical switch.

11. A light source, comprising:
    plural laser diode (LD) modules, each of which comprises an LD serving as a light-emitting element and a sensor detecting a temperature of said LD;
    a multiplexer for multiplexing plural lights respectively outputted from said plural LD modules;
    plural wavelength detectors for respectively detecting wavelengths of said plural lights; and
    a light-blocking device interrupting said plural lights unless a wavelength of all said plural lights fall within predetermined normal tolerances.

12. A light source according to claim 11, wherein said light-blocking device comprises an optical switch.

13. A method of ensuring that a correct wavelength is provided as an output of a light source comprising at least one laser diode and at least one temperature sensor, said method comprising:
    blocking an output of said light source unless said at least one temperature sensor indicates that a temperature of said at least one laser diode lies within a predetermined range.

14. A method of ensuring that a correct wavelength is provided as an output of a light source comprising at least one laser diode and at least one wavelength detector, said method comprising:
    blocking an output of said light source unless said at least one wavelength detector indicates that a wavelength of said at least one laser diode lies within a predetermined range.

* * * * *